United States Patent
Suh et al.

(10) Patent No.: US 7,187,068 B2
(45) Date of Patent: Mar. 6, 2007

(54) METHODS AND APPARATUSES FOR PROVIDING STACKED-DIE DEVICES

(75) Inventors: Daewoong Suh, Phoenix, AZ (US); Debendra Mallik, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/917,142

(22) Filed: Aug. 11, 2004

(65) Prior Publication Data

US 2006/0033193 A1 Feb. 16, 2006

(51) Int. Cl.
*H01L 23/02* (2006.01)
*H01L 23/48* (2006.01)

(52) U.S. Cl. ............... 257/685; 257/686; 257/777; 257/787; 257/E25.006; 257/E25.013; 257/E25.018; 257/E25.021; 257/E25.027; 257/E23.085

(58) Field of Classification Search ........... 257/685, 257/686, 723, 777, 778, E25.006, E25.013, 257/E25.018, E25.021, E25.027, E23.085, 257/E21.614; 438/47, 109, FOR. 426; 361/735, 361/790; 156/222
See application file for complete search history.

(56) References Cited

U.S. PATENT DOCUMENTS

| | | | |
|---|---|---|---|
| 5,040,052 A | 8/1991 | McDavid | |
| 5,422,435 A | 6/1995 | Takiar et al. | |
| 6,414,384 B1* | 7/2002 | Lo et al. | 257/685 |
| 6,448,506 B1 | 9/2002 | Glenn et al. | |
| 6,489,676 B2 | 12/2002 | Taniguchi et al. | |
| 6,813,157 B2 | 11/2004 | Chang | |
| 2002/0121687 A1 | 9/2002 | Winderl | |
| 2002/0135057 A1 | 9/2002 | Kurita | |
| 2002/0196650 A1 | 12/2002 | Chang | |
| 2003/0042564 A1 | 3/2003 | Taniguchi et al. | |
| 2005/0121764 A1* | 6/2005 | Mallik et al. | 257/686 |

FOREIGN PATENT DOCUMENTS

| | | | |
|---|---|---|---|
| JP | 200-178414 | * | 6/2000 |
| JP | 2001-223227 | * | 8/2001 |

OTHER PUBLICATIONS

PCT Search Report mailed Dec. 6, 2005 for PCT/US2005/027103.

* cited by examiner

*Primary Examiner*—Jasmine Clark
(74) *Attorney, Agent, or Firm*—Blakely, Sokoloff, Taylor & Zafman LLP

(57) ABSTRACT

Methods and apparatuses to provide a stacked-die device comprised of stacked sub-packages. For one embodiment of the invention, each sub-package has interconnections formed on the die-side of the substrate for interconnecting to another sub-package. The dies and associated wires are protected by an encapsulant leaving an upper portion of each interconnection exposed. For one embodiment of the invention the encapsulant is a stencil-printable encapsulant and the upper portion of the interconnection is exposed by use of a patterned stencil during application of the encapsulant.

20 Claims, 6 Drawing Sheets

METHODS AND APPARATUSES FOR PROVIDING STACKED-DIE DEVICES

FIELD

Embodiments of the invention relate generally to the field of integrated circuit devices and more specifically to methods and apparatuses for stacking die to create a stacked-die device.

BACKGROUND

If chips can be packaged more densely on the surface of the silicon circuit board, the dimensions and cost of the module can be reduced and system performance improved. One possible method of maximizing packaging densities involves placing chips atop one another to form three-dimensional stacks referred to as stacked-chip devices or stacked-die devices. Over the past several years there has been some interest in stacking chips where possible. Such chip-stacking schemes include stacking a number of decreasing sized chips in order to facilitate the wire-bonds or stacking a number of same-sized chips using spacers, or employing a beveling technique or using "T-cut" dies for the upper dies. As the trend moves toward stacking more die, from 2–4 stacked die, in typical devices today, to 6–8 stacked die in the near future, and more, problems arise.

For example, for a decreasing sized die scheme, eventually a point is reached where the size of the upper die is ineffective. For beveled or T-cut die schemes there is a limit on the difference in size between the lower and upper die in a stack (i.e., excessive overhang is more difficult to process and leads to less stable stacked-die devices.

Moreover, each of these schemes presents the problem of increased yield losses. As the number of stacked dies increases, the yield loss increases. The stacked-die device is not completely tested until it is complete. Temperature and other tolerance testing can be completed on individual dies at the die level, pre-stacking, but such testing is not indicative of overall functionality for the stacked-die device. Especially in cases where one of the stacked dies implements a logic processor device, testing at speed is not reliable prior to all of the electrical connections of the entire device being completed.

To address the problems of stack limitations and yield loss, the concept of sub-packaging of stacked dies has been introduced. In such a scheme, multiple sub-packages, each comprising a stacked-die device, are produced and tested. Upon successful testing, two or more sub-packages are stacked and electrically connected to form a stacked-die device.

FIG. 1 illustrates a stacked-die device comprised of stacked sub-packages in accordance with the prior art. Stacked-die device 100, shown in FIG. 1 includes three sub-packages 105a, 105b and 105c, which may be stacked-die packages such as packages 105b and 105c. Package 105a includes a substrate 110a with conductive balls 120 (e.g., ball grid array (BGA)) formed on the lower surface 111 of the substrate 110a. The conductive balls 120 are for electrically connecting the substrate 110a to a motherboard (not shown). A die 130a is disposed upon the upper surface 112 of the substrate 110a.

Package 105b comprises a stacked-die device having die 130c stacked atop die 130b. Package 105c comprises a stacked-die device having dies 130d–130f stacked one atop the other as shown. All of the dies, 130a, 130b and 130c, and 130d–130f are electrically connected to respective substrates 110a–110c or to one another with wire-bonds 140. The wire-bonds 140 for each sub-package are typically covered with a molding compound 145 for protection prior to stacking the sub-packages. The sub-packages are electrically connected to each other with interconnections 150, which may be copper joints between the sub-packages.

The stacked-die device 100 addresses some of the disadvantages of stack limitations and yield loss, but has disadvantages as well. For example, the copper implants that form the connecting joints between sub-packages require additional space. That is, the interconnections 150 between sub-packages have to be somewhat removed from the wire-bonds 140 so that they are not covered by the molding compound 145. This increases the size of the stacked-die device. Also, forming the copper implants requires additional processes (e.g., drilling), which increase the cost and practically limit the configuration of each package to a standard shape and size. FIG. 1A is a top-down view of a sub-package for the stacked-die device 100 described above in reference to FIG. 1. As shown in FIG. 1A, the copper implants 150 used to connect sub-packages have a carrier 155. The carrier is beyond the area on the substrate 110a in which wire-bonds 140 may be placed. For a given size, die 130a, the substrate 110a and hence the sub-package 105a need to be large enough to accommodate the carrier 155.

BRIEF DESCRIPTION OF THE DRAWINGS

The invention may be best understood by referring to the following description and accompanying drawings that are used to illustrate embodiments of the invention. In the drawings.

DETAILED DESCRIPTION

In the following description, numerous specific details are set forth. However, it is understood that embodiments of the invention may be practiced without these specific details. In other instances, well-known circuits, structures and techniques have not been shown in detail in order not to obscure the understanding of this description.

Reference throughout the specification to "one embodiment" or "an embodiment" means that a particular feature, structure, or characteristic described in connection with the embodiment is included in at least one embodiment of the present invention. Thus, the appearance of the phrases "in one embodiment" or "in an embodiment" in various places throughout the specification are not necessarily all referring to the same embodiment. Furthermore, the particular features, structures, or characteristics may be combined in any suitable manner in one or more embodiments.

Moreover, inventive aspects lie in less than all features of a single disclosed embodiment. Thus, the claims following the Detailed Description are hereby expressly incorporated into this Detailed Description, with each claim standing on its own as a separate embodiment of this invention.

Figure 2:
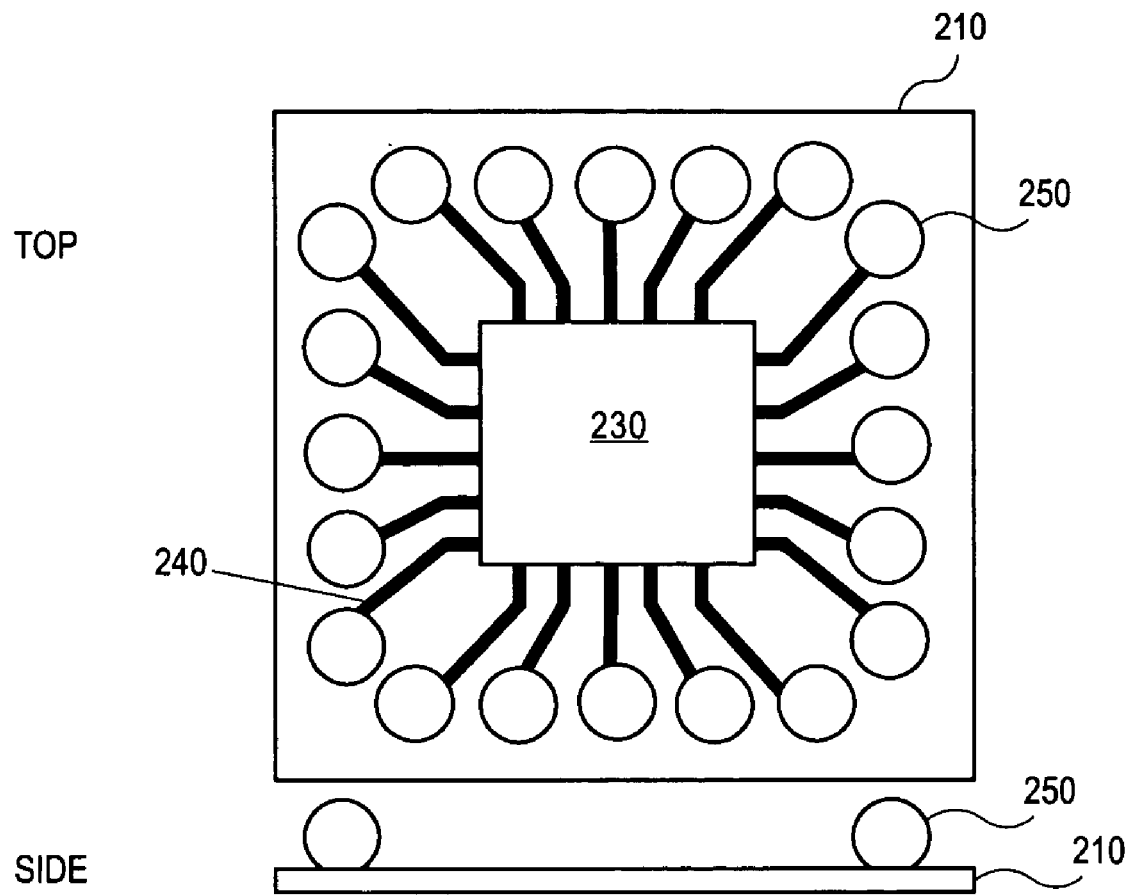
FIG. 2 illustrates top and side views of a substrate for a sub-package in accordance with one embodiment of the invention.

FIG. 2 illustrates top and side views of a substrate for a sub-package in accordance with one embodiment of the invention. The substrate 210 has interconnections 240 and sub-package interconnections 250 that may be, for example, conductive metal balls, that can be used to electrically connect one sub-package to another sub-package above it in a stacked sub-package configuration. The sub-package interconnections 250 may be similar to the BGA typically employed on the bottom side of a die for surface mount packaging. In accordance with one embodiment of the invention, the sub-package interconnections are formed on the top-side (die side) of the substrate. The sub-package interconnections 250 are discrete and therefore wire-bonding can be accomplished near and between the sub-package interconnections 250. For one embodiment, prior to forming the sub-package interconnections 250 that will provide the interconnection between sub-packages, wire-bonds can be formed all the way up to where the sub-package interconnections will be placed. The sub-package interconnections are electrically connected to the die 230 through interconnections 240. The bottom-side of the substrate may have a conventional BGA or metal lands for electrically connecting to the sub-package below.

Figure 1:
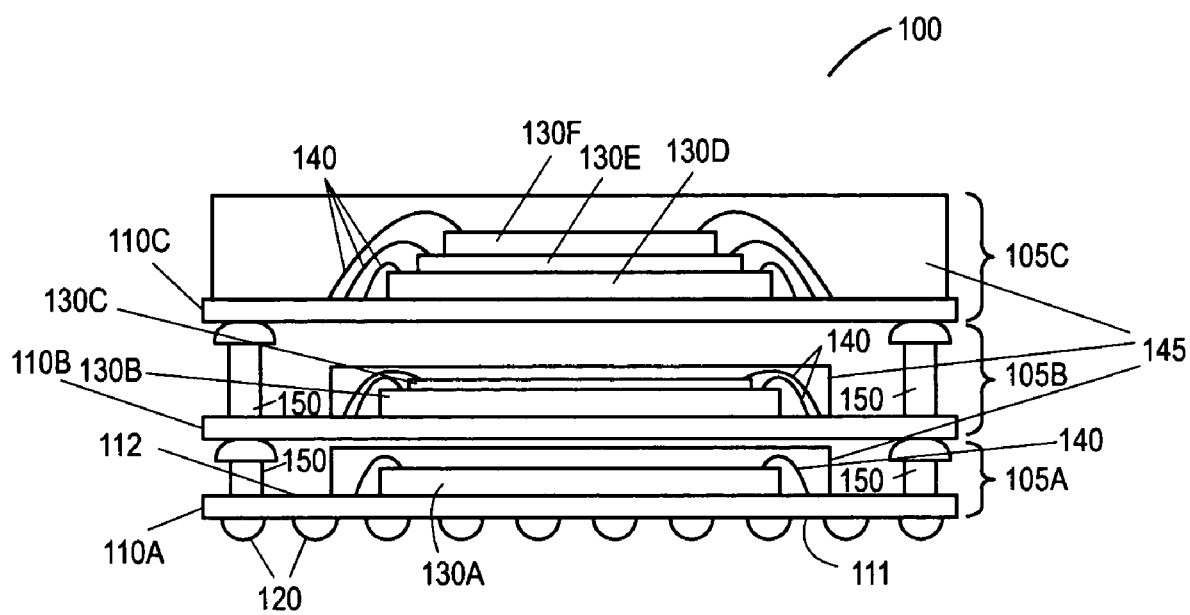
FIG. 1 illustrates a stacked-die device comprised of stacked sub-packages in accordance with the prior art.
Figure 1A:
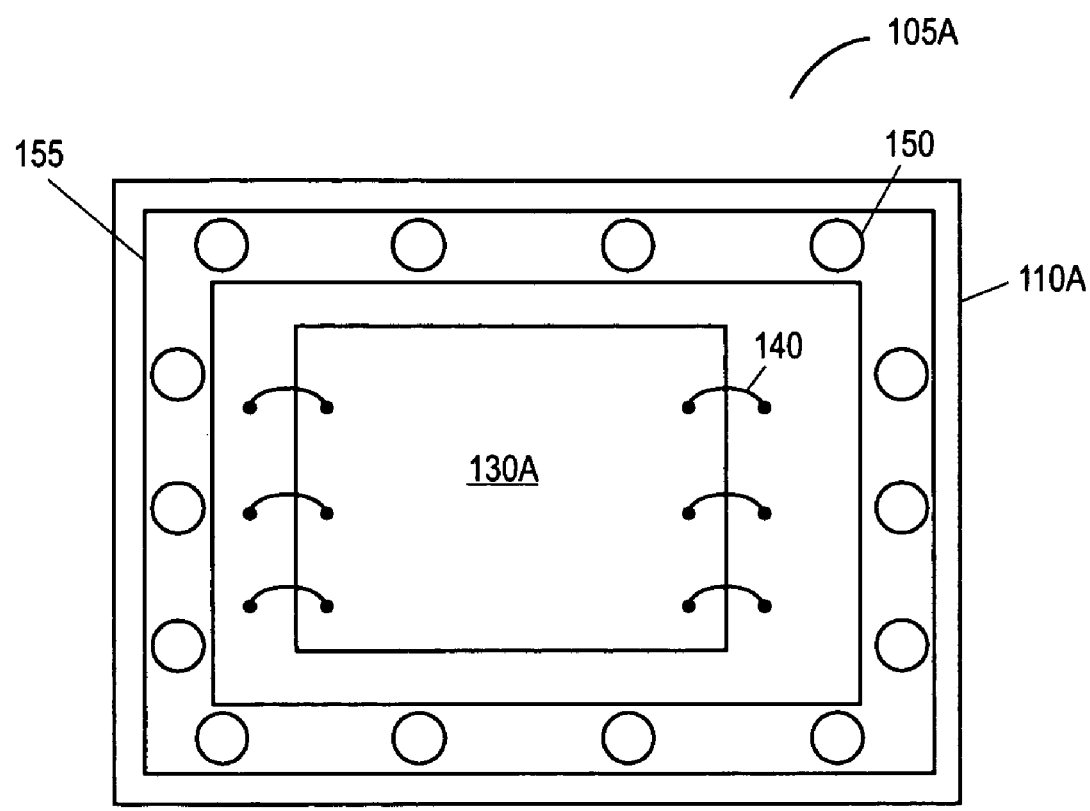
FIG. 1A is a top-down view of a sub-package for a stacked-die device in accordance with the prior art.
Figure 3A:
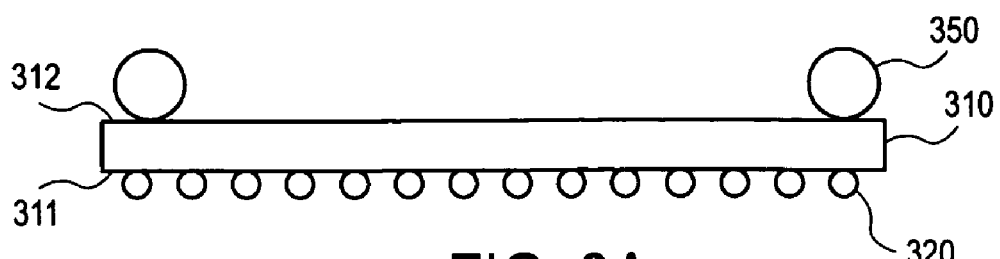
FIGS. 3A–3D illustrate a process for producing a sub-package in accordance with one embodiment of the invention.

FIGS. 3A–3D illustrate a process for producing a sub-package in accordance with one embodiment of the invention. As shown in FIG. 3A, substrate 310 is a conventional substrate having features for die attach and wire-bonding, or flip chip attach. The bottom surface 311 of substrate 310 has conductive metal balls 320 as described above in reference to FIG. 1. The substrate 310 has sub-package interconnections 350 formed on the top surface 312. The sub-package interconnections 350 are attached to metal pads (not shown) formed near the periphery of substrate 310. The sub-package interconnections 350, which may be conductive metal balls, may be formed of solder, which may be a lead/tin alloy. In alternative embodiments, the sub-package interconnections 350 may be made of copper or other suitable conductive metals. For such embodiments, the sub-package interconnections 350 may be attached using a process similar to a conventional BGA ball attach method.

Figure 3B:
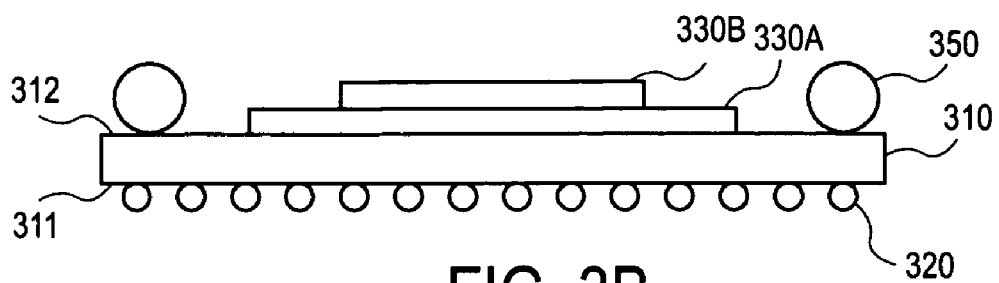

For one embodiment of the invention, following the formation of the sub-package interconnections 350 on the top surface 312 of the substrate 310, integrated circuit chips (dies) are attached to the substrate 310. In accordance with one embodiment of the invention, the dies may implement various types of memory devices or logic processor devices. The dies, which may be one die or multiple dies in a stacked-die configuration, are attached to the substrate 310 and to one another using conventional die attach methods and materials. As shown in FIG. 3B, die 330a is attached to the top surface 312 of substrate 310 and die 330b is stacked atop, and attached to, die 330a. Each of the dies may be electrically connected to the substrate and to one another using conventional methods (e.g., wire-bonding or flip chip attachment). The sub-package interconnections 350 extend above the top surface 312, a greater distance than the die stack.

Figure 3C:
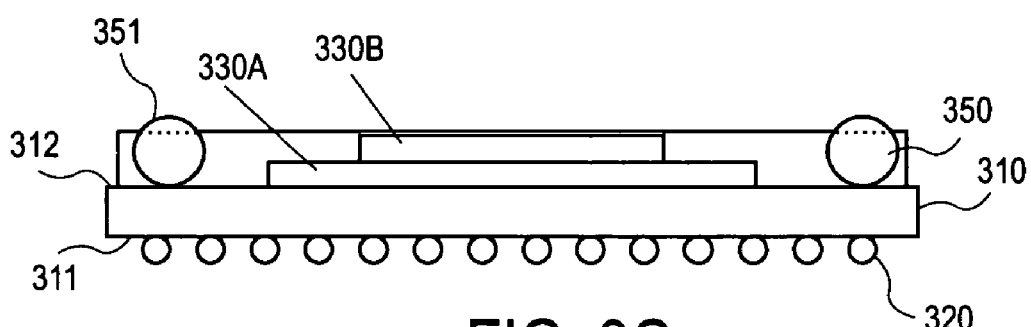

As shown in FIG. 3C, the attached die or die-stack is then encapsulated to protect the dies and associated wires (e.g., wire-bonds), if any, while leaving an upper portion 351 of the sub-package interconnections 350 exposed. The encapsulant extends above the upper surface 312 higher than the die stack, but not as high as the sub-package interconnections 350. For one embodiment of the invention, the encapsulant 345 is a thermosetting material such as epoxy or polymer resin which may contain various amounts (e.g., from 0–80% by weight) of silica or other inorganic particles to modify the CTE, modulus, or viscosity. For one embodiment of the invention, such thermosetting material may contain fluxes to provide fluxing capabilities during a subsequent reflow process. For one embodiment of the invention, the encapsulation of the die-stack, as shown in FIG. 3C, is effected through a stencil printing process described in greater detail below.

Figure 3D:
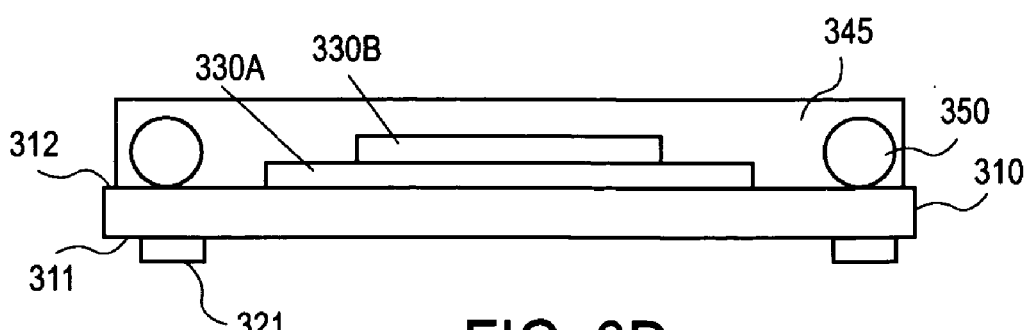

As shown in FIG. 3D, the encapsulant 345 may encompass the entire sub-package interconnections 350. The sub-package interconnections 350 may remain encapsulated where the sub-package is the top most sub-package of a stacked sub-package device. Where the sub-package interconnections will be used to electrically connect the sub-package to another sub-package above it in a stacked sub-package configuration, an upper portion of the sub-package interconnections 350 can be exposed through known methods such as grinding or laser drilling.

Sub-packages that will be stacked atop another sub-package may not include conductive metal balls such as a BGA, but may include land pads 321 corresponding to the sub-package interconnections of the sub-package on which they are stacked.

Encapsulation

Figure 4:
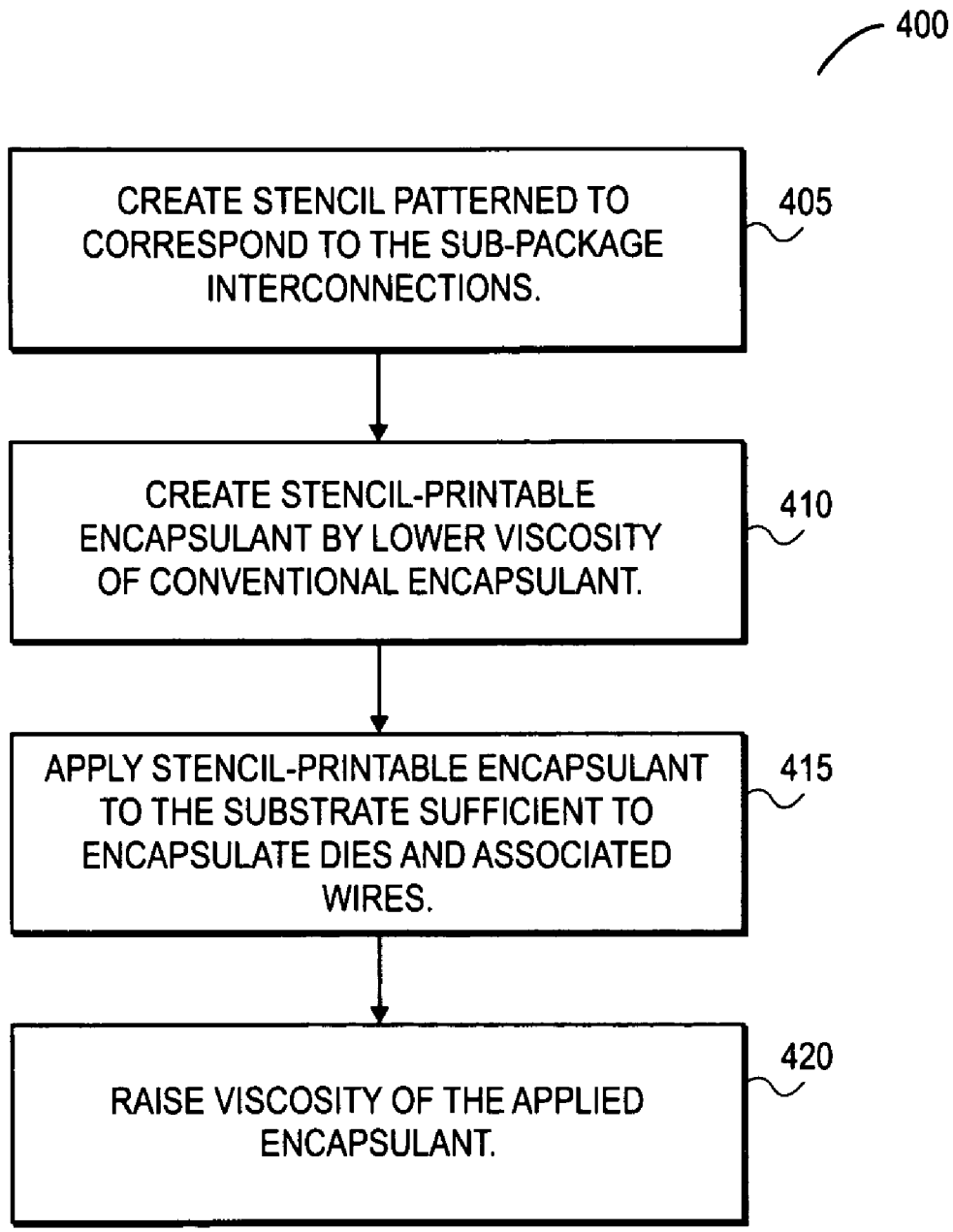
FIG. 4 illustrates a process for encapsulating the dies of a sub-package while leaving an upper portion of the sub-package interconnections exposed in accordance with one embodiment of the invention.

For one embodiment of the invention, the encapsulation of the dies of a sub-package is effected using a stencil-printing process. The height coverage of the encapsulant is controlled by optimizing the stencil-printing process and material selection for improved processability, encapsulation performance, and thermomechanical properties. FIG. 4 illustrates a process for encapsulating the dies of a sub-package while leaving an upper portion of the sub-package interconnections exposed in accordance with one embodiment of the invention. Process 400, shown in FIG. 4, begins at operation 405 in which a stencil is provided and placed over the substrate. The stencil, which may be a thin nickel plate, is patterned to cover some upper portion of each of the sub-package interconnections.

At operation 410, a stencil-printable encapsulant is provided. Typical encapsulants are not stencil printable, but can be made so by decreasing their viscosity, for example by the addition of solvents to the encapsulation material.

At operation 415, the stencil-printable encapsulant is applied to encapsulate the dies. The amount of encapsulant is controlled such that dies (e.g., die-stack) and associated wires are completely encapsulated while an upper portion of each of the sub-package interconnections is left exposed. The lower portion of the sub-package interconnections is also encapsulated. In practice, some of the encapsulant may remain on the upper portions of the sub-package interconnections, but the low-viscosity encapsulant helps to reduce the amount of such encapsulant.

At operation 420, the substrate is subjected to an elevated temperature in order to remove solvents (i.e., evaporate some or all of the solvents added in operation 410). For one embodiment of the invention, the substrate is subjected to a temperature of approximately 100° C. for approximately 2 hours. The temperature and time for such an evaporation process may be modified, depending upon the amount of solvents to be evaporated. The solvents, which aid in the stencil printing process, are removed as much as possible prior to reflow to reduce voids that may form during curing/reflow if the solvents are not removed. The removal of the solvents increases the viscosity of the applied encapsulant. For one embodiment of the invention, after baking, the encapsulant is cured (cross linked) during a subsequent reflow process described more fully below. For one embodiment of the invention, such curing is effected concurrently with the solder reflow. For one embodiment of the invention, the curing kinetics of the encapsulant is specifically tailored so as to reduce interference with joint formation.

Reflow

Two or more sub-packages are interconnected to form a stacked sub-package device in accordance with one embodiment of the invention. A sub-package is stacked atop another such that land pads or conductive metal balls on the bottom side of the top most sub-package correspond to the exposed sub-package interconnections of the next lower sub-package in the stack. A reflow process, or other conventional surface mount process, is then effected to create an interconnection between the sub-packages. During reflow, the viscosity of the encapsulant is decreased due to the increased temperature. There is a wetting force between the land pads of the upper sub-package and the sub-package interconnections of the lower sub-package, so that any residual encapsulant material on the surface of the sub-package interconnections is forced out, allowing proper formation of interconnections between the sub-packages.

Figure 5:
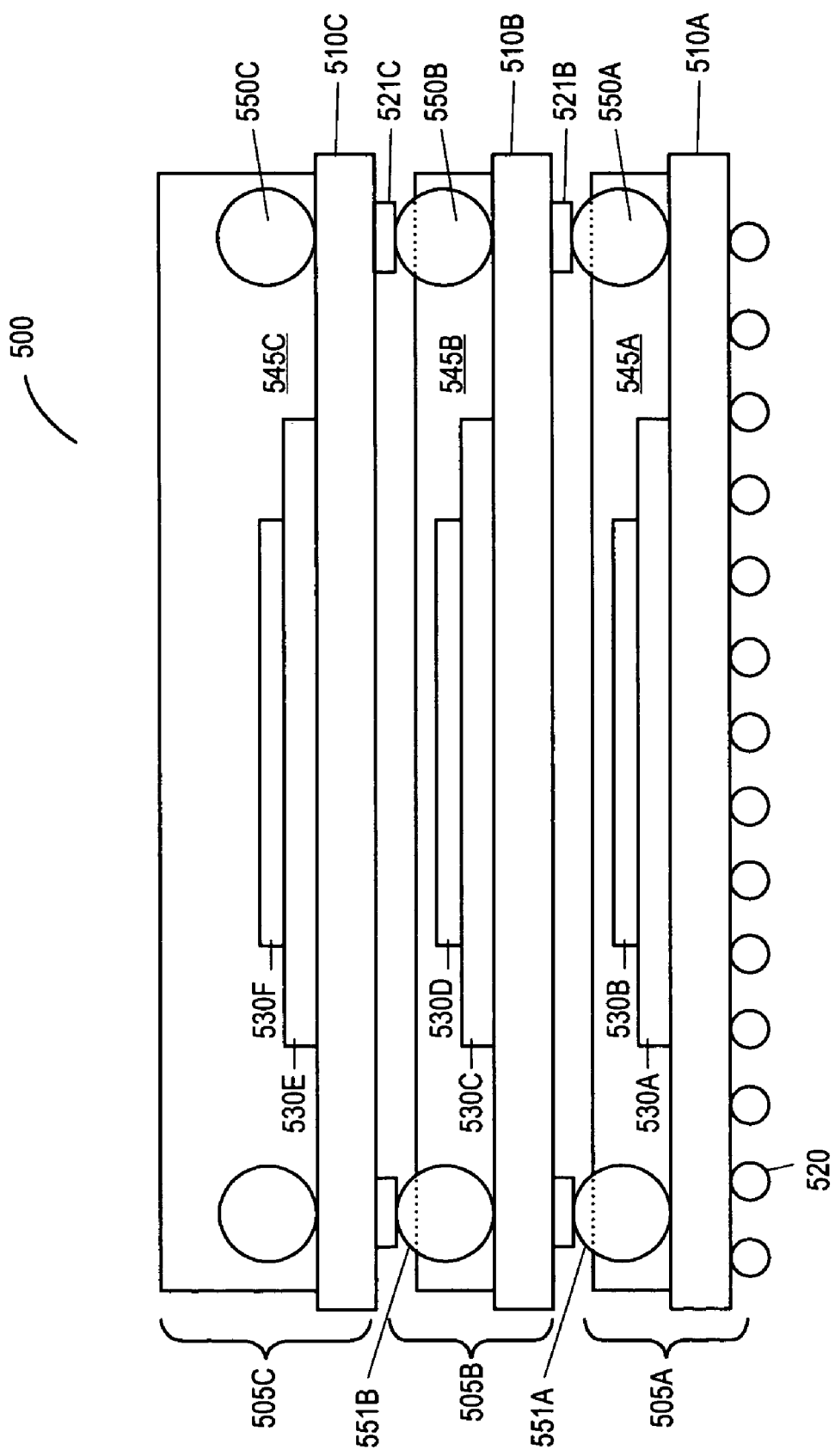
FIG. 5 illustrates a stacked-die device comprised of stacked sub-packages in accordance with one embodiment of the invention.

FIG. 5 illustrates a stacked-die device comprised of stacked sub-packages in accordance with one embodiment of the invention. Stacked-die device 500, shown in FIG. 5 includes three sub-packages 505a, 505b and 505c, which may be stacked-die sub-packages created in accordance with an embodiment of the invention. Sub-package 505a includes a substrate 510a with conductive balls 520. Sub-package 505a has dies 530a and 530b that are encapsulated with encapsulant 545a. The upper portion 551a of sub-package interconnections 550a are exposed and form an interconnection with land pads 521b formed on the bottom surface of sub-package 505b. Sub-package 505b has dies 530c and 530d attached to substrate 510b that are encapsulated with encapsulant 545b. The upper portion 551b of sub-package interconnections 550b are exposed and form an interconnection with land pads 521c formed on the bottom surface of sub-package 505c. Sub-package 505c has dies 530e and 530f attached to substrate 510c that are encapsulated with encapsulant 545c. The entire sub-package interconnections 550c are encapsulated as well. The stacked-die device 500 is exemplary as are each of the stacked sub-packages of stacked-die device 500. The stacked-die device may have any reasonable number of stacked sub-packages and each sub-package may have one die or any number of stacked die.

General Matters

Embodiments of the invention provide methods and apparatuses for producing a stacked die device having a stacked sub-package configuration. Various embodiments of the invention have been described including specific features or processes. For alternative embodiments of the invention, the features or processes may be modified. For example, the sub-package interconnections, although generally described as conductive metal balls, may be any suitable material or shape in accordance with alternative embodiments of the invention.

An embodiment of the invention has been described as a process having various operations. Such operations are exemplary and may be described in their most basic form, but operations can be added to or deleted from the process, or modified, without departing from the basic scope of the invention in accordance with various embodiments. For example, in process 400, described above in reference to FIG. 4, the operation of covering the sub-package interconnections may be omitted. For such a process, the upper portion of the sub-package interconnections may be exposed by dragging a squeegee across the surface of the applied encapsulant to expose the sub-package interconnections. For such an embodiment, the limited encapsulant material remaining on the surface of the sub-package interconnections will flow down off of the surface during reflow due to the increased viscosity of the encapsulant and the wetting between the sub-package interconnections and the corresponding land pads of the connecting sub-package. Thus, any residual encapsulant does not interfere with proper interconnection formation.

In accordance with one embodiment of the invention, a no-flow underfill material may be applied prior to reflow for better connection formation and thermal energy dissipation. In an alternative embodiment of the invention, the underfill material may be applied after the sub-packages have been connected.

While the invention has been described in terms of several embodiments, those skilled in the art will recognize that the invention is not limited to the embodiments described, but can be practiced with modification and alteration within the spirit and scope of the appended claims. The description is thus to be regarded as illustrative instead of limiting.

What is claimed is:

1. An apparatus comprising:
   a first substrate having a top surface and bottom surface;
   a set of one or more dies attached to the top surface of the first substrate, the one or more dies extending above the top surface a first distance;
   one or more interconnections formed on the top surface of the first substrate, the one or more interconnections extending above the top surface a second distance;
   a planar encapsulant disposed upon the top surface of the first substrate and extending above the top surface a third distance, the third distance greater than the first distance and less than the second distance such that the one or more dies are encapsulated and a portion of the one or more interconnections are exposed; and
   a second substrate above the first substrate, the second substrate having a bottom surface and one or more conductive pads formed on the bottom surface of the second substrate, each conductive pad extending from the bottom surface of the second substrate down to the second distance without extending to the third distance.

2. The apparatus of claim 1 wherein the one or more dies are attached to one another in a stacked-die configuration and the uppermost portion of an uppermost die extends above the top surface the first distance.

3. The apparatus of claim 1 wherein the one or more dies have associated wires, the associated wires extending above the top surface a fourth distance, the fourth distance less than the first distance such that the associated wires are encapsulated.

4. The apparatus of claim 1 wherein the encapsulant is a thermal setting material.

5. The apparatus of claim 1 wherein
   the second substrate further has a top surface and a second set of one or more dies attached to the top surface of the second substrate, and each conductive pad is electrically coupled to a corresponding interconnection of the one or more interconnections formed on the top surface of the first substrate.

6. The apparatus of claim 4 wherein the thermal setting material is an epoxy.

7. The apparatus of claim 3 wherein the associated wires of one or more of the dies comprise wire-bonds.

8. The apparatus of claim 1 wherein one or more of the dies has a logic processor device implemented thereon.

9. A system comprising:
a first sub-package; and
a second sub-package, the second sub-package stacked atop the first sub-package and electrically connected thereto, each of the first sub-package and the second sub-package including a substrate having one or more dies attached to a top surface of the substrate and one or more interconnections formed upon the top surface of the substrate, and a stencil-printable encapsulant stencil-printed onto the top surface of the substrate such that the one or more dies are encapsulated and an upper portion of each of the one or more interconnections is exposed, wherein the encapsulant of the first sub-package has a planar top surface and the upper portion of each of the one or more interconnections of the first sub-package extends above the planar top surface, and the substrate of the second sub-package has one or more conductive pads formed on a bottom surface, each conductive pad extending down from the bottom surface of the substrate of the second sub-package, contacting a corresponding interconnection of the first sub-package, without extending to the planar top surface.

10. The system of claim 9 wherein each conductive pad is electrically coupled to the corresponding interconnection of the one or more interconnections formed upon the top surface of the substrate of the first sub-package.

11. The system of claim 10 further comprising:
one or more additional sub-packages stacked successively atop the second sub-package, each additional sub-package including a substrate having one or more dies attached to a top surface of the substrate and one or more interconnections formed upon the top surface of the substrate, and an encapsulant disposed upon the top surface of the substrate such that the one or more dies are encapsulated and an upper portion of each of the one or more interconnections is exposed, and one or more conductive areas formed on a bottom surface, each conductive area electrically coupled to a corresponding interconnection of the one or more interconnections formed upon the top surface of the substrate of an immediately preceding sub-package.

12. The system of claim 9 wherein the one or more dies are attached to one another in a stacked-die configuration.

13. The system of claim 9 wherein the one or more dies have associated wires, the associated wires completely encapsulated by the encapsulant.

14. The system of claim 13 wherein the associated wires of one or more of the dies comprise wire-bonds.

15. The system of claim 9 wherein the encapsulant is a thermal setting material.

16. The system of claim 15 wherein the thermal setting material is an epoxy.

17. The system of claim 9 wherein one or more of the dies implements a logic processor device.

18. The system of claim 16 wherein the thermal setting material contains a flux.

19. The system of claim 9 wherein the encapsulant contains 0–80% silica.

20. The system of claim 9 wherein the encapsulant contains a viscosity decreasing solvent.

* * * * *